US012738306B2

(12) United States Patent
Mihajlovic et al.

(10) Patent No.: US 12,738,306 B2
(45) Date of Patent: Sep. 15, 2026

(54) MAGNETIC TUNNEL JUNCTION WITH DUAL REFERENCE LAYERS HAVING PARALLEL MAGNETIZATION DIRECTIONS AND METHODS FOR OPERATING THE SAME

(71) Applicant: SANDISK TECHNOLOGIES LLC, Addison, TX (US)

(72) Inventors: Goran Mihajlovic, San Jose, CA (US); Wonjoon Jung, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 126 days.

(21) Appl. No.: 18/600,384

(22) Filed: Mar. 8, 2024

(65) Prior Publication Data

US 2025/0285669 A1 Sep. 11, 2025

(51) Int. Cl.

| | |
|---|---|
| ***G11C 11/00*** | (2006.01) |
| ***G11C 11/16*** | (2006.01) |
| ***H10B 61/00*** | (2023.01) |
| ***H10N 50/10*** | (2023.01) |
| ***H10N 50/85*** | (2023.01) |

(52) U.S. Cl.

CPC ........ *G11C 11/161* (2013.01); *G11C 11/1673* (2013.01); *G11C 11/1675* (2013.01); *H10B 61/00* (2023.02); *H10N 50/10* (2023.02); *H10N 50/85* (2023.02)

(58) Field of Classification Search

CPC .............. G11C 11/161; G11C 11/1675; G11C 11/1673; G11C 11/18; G11C 11/16; G11C 11/1697; G11C 13/0004; G11C 11/54; G11C 11/1659; H01F 10/3286; H01F 10/3204; H01F 10/3236; H01F 10/3272; H01F 10/3263; H01F 10/329

USPC .......................................................... 365/158

See application file for complete search history.

(56) References Cited

U.S. PATENT DOCUMENTS

| | | | | |
|---|---|---|---|---|
| 6,667,901 | B1 | 12/2003 | Perner et al. | |
| 6,744,086 | B2 * | 6/2004 | Daughton ............. | G11C 11/161 257/295 |
| 6,795,280 | B1 | 9/2004 | Song et al. | |
| 8,058,696 | B2 | 11/2011 | Ranjan et al. | |
| 8,344,242 | B2 | 1/2013 | Fiorenza et al. | |

(Continued)

OTHER PUBLICATIONS

Hu, G. et al., "STT-MRAM with double magnetic tunnel junctions," IEDM 2015, 668 (2015).

(Continued)

*Primary Examiner* — Viet Q Nguyen
(74) *Attorney, Agent, or Firm* — THE MARBURY LAW GROUP PLLC

(57) ABSTRACT

A magnetoresistive memory cell includes a first electrode; a second electrode; and a layer stack located between the first electrode and the second electrode and comprising, from one end to another, a first reference layer, a first tunnel barrier layer, a free layer, a second tunnel barrier layer, and a second reference layer. A first one of the first reference layer and the second reference layer comprises a positive spin polarization material. A second one of the first reference layer and the second reference layer comprises a negative spin polarization material. A magnetization direction of the second reference layer is parallel to a magnetization direction of the first reference layer.

20 Claims, 9 Drawing Sheets

(56) References Cited

U.S. PATENT DOCUMENTS 8,374,048 B2 2/2013 Apalkov
8,399,941 B2 3/2013 Apalkov et al.
8,422,285 B2 4/2013 Apalkov et al.
8,766,383 B2 7/2014 Apalkov et al.
9,184,375 B1 11/2015 Tang et al.
9,508,890 B2 11/2016 Li et al.
9,508,924 B2 11/2016 Tang et al.
9,595,917 B2 3/2017 Kan et al.
9,792,971 B2 10/2017 Carey et al.
9,805,444 B2 10/2017 Lee et al.
9,818,931 B2 11/2017 Tang et al.
10,276,226 B2 4/2019 Schafer et al.
10,333,058 B2 * 6/2019 Aradhya ............. H01F 10/3272
10,522,746 B1 12/2019 Sundar et al.
10,622,547 B2 * 4/2020 Chia ...................... H10N 50/80
10,719,298 B1 7/2020 Braganca
10,964,748 B1 * 3/2021 Prasad ................ G11C 11/1675
10,991,407 B1 4/2021 Prasad et al.
11,005,034 B1 5/2021 Prasad et al.
11,056,640 B2 7/2021 Prasad et al.
11,127,422 B1 9/2021 Liu et al.
11,217,626 B2 1/2022 Campiglio et al.
11,283,006 B1 3/2022 Freitag et al.
11,361,805 B2 6/2022 Mihajlovic et al.
11,404,632 B2 8/2022 Prasad
11,587,708 B2 2/2023 Nguyen et al.
11,793,002 B2 * 10/2023 Woo ........................ G11C 11/54 257/4
12,336,189 B2 * 6/2025 Sasaki .................... H10B 61/22
2006/0083057 A1 4/2006 Nakayama et al.
2009/0273972 A1 11/2009 Han et al.
2009/0303779 A1 12/2009 Chen et al.
2010/0020592 A1 1/2010 Hosotani et al.
2010/0053822 A1 3/2010 Xi et al.
2010/0078742 A1 4/2010 Zheng et al.
2010/0080054 A1 4/2010 Abe
2011/0133299 A1 6/2011 Zhu et al.
2012/0015099 A1 1/2012 Sun et al.
2012/0250391 A1 10/2012 Cambou
2012/0290773 A1 11/2012 Naccache
2015/0294707 A1 10/2015 Apalkov et al.
2016/0171135 A1 6/2016 Datta et al.
2017/0263856 A1 9/2017 Iwayama
2018/0061467 A1 3/2018 Kan et al.
2019/0206464 A1 7/2019 Tzoufras et al.
2020/0341079 A1 10/2020 Swerts et al.
2020/0365195 A1 11/2020 Couet et al.
2021/0126190 A1 4/2021 Couet et al.
2021/0135090 A1 5/2021 Sun
2021/0135091 A1 5/2021 Park et al.
2021/0210677 A1 7/2021 Prasad
2021/0320245 A1 10/2021 Kalitsov et al.
2021/0336128 A1 10/2021 Reznicek et al.
2022/0013714 A1 1/2022 Park et al.
2022/0093305 A1 3/2022 Diao et al.
2022/0301612 A1 9/2022 Worledge et al.
2022/0302368 A1 9/2022 Worledge et al.
2023/0084970 A1 3/2023 Okamura et al.
2023/0119656 A1 4/2023 Hong et al.
2024/0005973 A1 1/2024 Le et al.
2024/0006109 A1 1/2024 Le et al.
2024/0032437 A1 1/2024 Le et al.
2025/0384909 A1 * 12/2025 Wan ...................... G11C 11/161
2025/0384926 A1 * 12/2025 Mihajlovic ......... G11C 11/5607

OTHER PUBLICATIONS

Sunaga, K et al., "Inverse tunnel magnetoresistance in magnetic tunnel junctions with an Fe4N electrode," Journal of Applied Physics 102, 013917, 2007.

Suto, H et al., "Negative spin polarization of Mn2VGa Heusler alloy thin film studied in current-perpendicular-to-plane giant magnetoresistance devices," 2023 IEEE International Magnetic Conference, Short papers, 10.1109/INTERMAGShortPapers58606.2023.10228243, May 2023.

Suto, H et al., "Study on FeCr thin film for a spintronic material with negative spin polarization," Journal of Magnetism and Magnetic Materials 557 (2022) 169474.

Worledge, D.C., et al., "STT-MRAM—Status and outlook", Session D1 TMRC 2022, The 33rd Magnetic Recording Conference Digests, Hosted by Western Digital, Milpitas, CA, pp. 52-53 (Aug. 2022). DOI: 10.1109/TMRC56419.2022.9918598.

Worledge, D.C., "Theory of Spin Torque Switching Current for the Double Magnetic Tunnel Junction," IEEE Magnetics Letters, vol. 8 (2017) DOI: 10.1109/LMAG.2017.27073.

Yasui, S. et al., "Large Inverse Tunnel Magnetoresistance in Magnetic Tunnel Junctions with an Fe3O4 Electrode," Physical Review Applied 15, 034042 (2021); DOI: 10.1103/PhysRevApplied.15.034042.

U.S. Appl. No. 18/065,098, filed Dec. 13, 2022, Western Digital Technologies, Inc.

* cited by examiner

Electrons with downward spin
Electron flow direction
Negative spin polarization material
Upward fixed magnetization direction
Electrons with random spin Electrons with upward spin
Electron flow direction
Positive spin polarization material
Upward fixed magnetization direction
Electrons with random spin

MAGNETIC TUNNEL JUNCTION WITH DUAL REFERENCE LAYERS HAVING PARALLEL MAGNETIZATION DIRECTIONS AND METHODS FOR OPERATING THE SAME

FIELD

The present disclosure relates generally to the field of magnetic memory devices and specifically to a magnetic memory device including a magnetic tunnel junction with dual reference layers having parallel magnetization directions and methods for operating the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer.

When a sufficient amount of spin-polarized current passes through the free layer, spin-transfer torque can flip the magnetization orientation of the free layer. A resistance differential of a magnetic tunnel junction between different magnetization states of the free layer can be employed to store data within the magnetoresistive random access memory (MRAM) cell depending on whether the magnetization of the free layer is parallel or antiparallel to the magnetization of the reference layer.

SUMMARY

According to an embodiment of the present disclosure, a device comprising a magnetoresistive memory cell is provided. The magnetoresistive memory cell comprises: a first electrode; a second electrode; and a layer stack located between the first electrode and the second electrode and comprising, from one end to another, a first reference layer, a first tunnel barrier layer, a free layer, a second tunnel barrier layer, and a second reference layer, wherein: a first one of the first reference layer and the second reference layer comprises a positive spin polarization material; a second one of the first reference layer and the second reference layer comprises a negative spin polarization material; and a magnetization direction of the second reference layer is parallel to a magnetization direction of the first reference layer.

According to an embodiment of the present disclosure, a method of operating a spin transfer torque (STT) magnetoresistive random memory (MRAM) device includes providing a magnetoresistive memory cell which comprises a first electrode, a second electrode, and a layer stack located between the first electrode and the second electrode and comprising, from one end to another, a first reference layer, a first tunnel barrier layer, a free layer, a second tunnel barrier layer, a second reference layer, wherein the first reference layer and the second reference layer have magnetization directions that are parallel to each other; applying a read bias across the first electrode and the second electrode while the magnetization directions of the first reference layer and the second reference layer are parallel to each other; and determining a magnetization direction of the free layer relative to the magnetization directions of the first reference layer and the second reference layer based on a magnitude and a direction of electrical current that flows through the layer stack under the read bias voltage.

DETAILED DESCRIPTION

Figure 1:
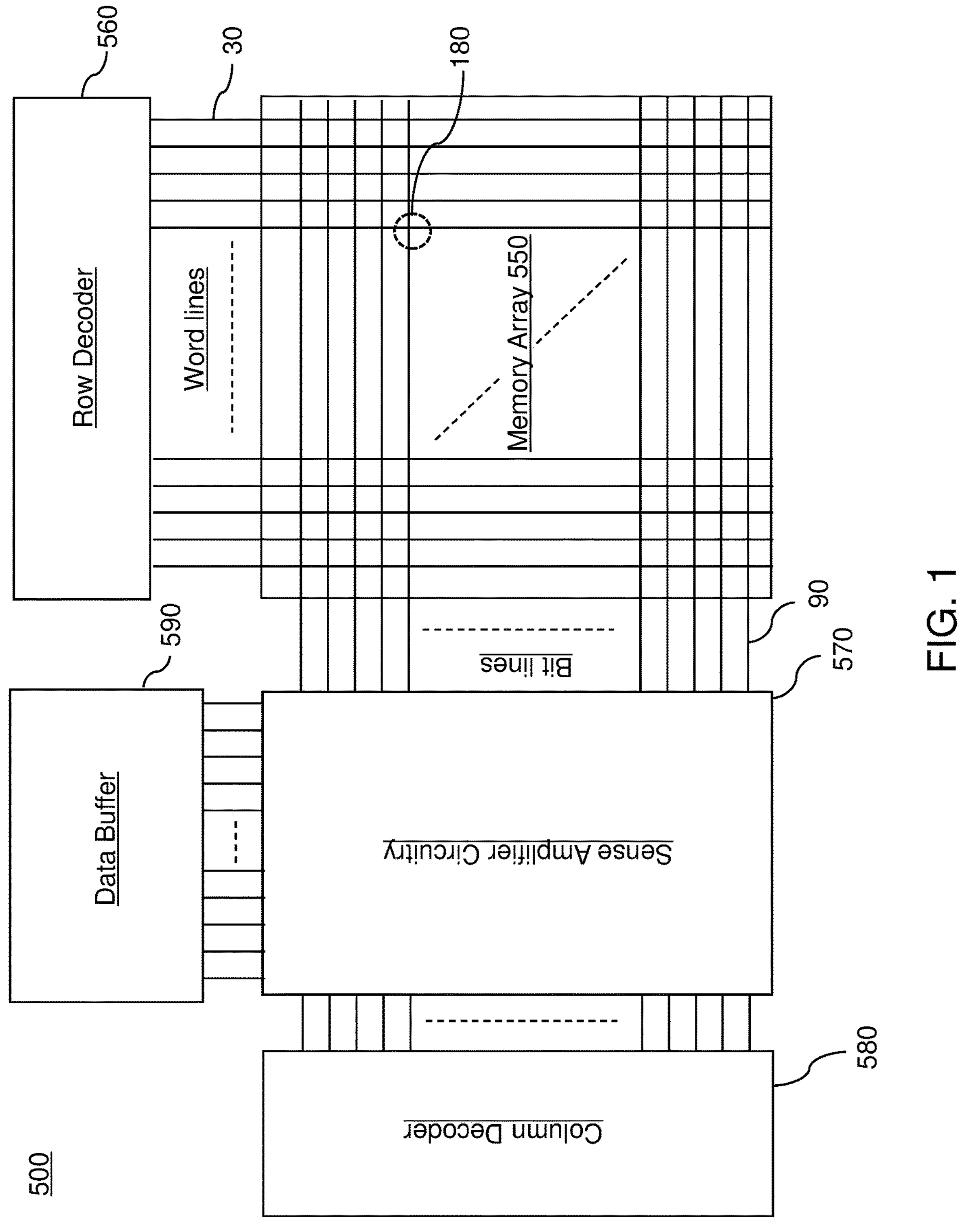
FIG. 1 is a schematic diagram of a memory device including an array of magnetoresistive memory cells according to an embodiment of the present disclosure.

Various spin-transfer torque magnetic random access memory (STT-MRAM) devices are known in the art. Some of the STT MRAM devices comprise dual (e.g., double) magnetic tunnel junction (MTJ) STT MRAM devices which contain two references layers on opposite sides of the free layer. Such dual MTJ STT-MRAM devices include a first (e.g., top) reference layer having a magnetization direction that is antiparallel to the magnetization direction of a second (e.g., bottom) reference layer in order to provide additive STT to the free layer and thus reduce the current needed to switch the free layer magnetization direction. However, such dual MTJ STT-MRAM devices suffer from a write error rate limitation due to back-hopping of the first reference layer. This back-hopping problem is more severe when the free layer is in the parallel state in which the magnetization directions of the free layer and the second reference layer are parallel to each other, but the magnetization direction of the free layer is antiparallel to the magnetization direction of a second reference layer. The embodiments of the present disclosure are directed to a dual MTJ STT-MRAM device including a magnetic tunnel junction with dual reference layers having parallel magnetization directions (i.e., in parallel alignment) and methods for operating the same, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

A conventional vertical dual (or sometimes also called double) MTJ STT-MRAM memory cell comprises a layer stack including a bottom hard magnetization layer, a bottom antiferromagnetic coupling layer (a first antiferromagnetic coupling layer), a bottom reference layer, a first tunnel barrier, a free layer, a second tunnel barrier, a top reference layer, a second antiferromagnetic coupling layer (a second antiferromagnetic coupling layer), and a top hard magnetization layer. The layer stacking direction in the vertical cell is perpendicular to the top surface of the supporting substrate. The magnetization direction of the top reference layer is antiparallel to the magnetization direction of the bottom reference layer. The first tunnel barrier is instrumental in providing a tunneling magnetoresistance (TMR). In a vertical memory cell in which the bottom reference layer has an upward magnetization direction and the top reference layer has a downward magnetization direction, the magnetic state of the free layer can be programmed from an antiparallel to parallel state by inducing flow of electrons from bottom to top, thereby aligning the free layer's magnetization direction to an upward direction. This state is referred to as a parallel state because the magnetization direction of the free layer is parallel to the magnetization direction of the bottom reference layer. The parallel state generates direct spin-transfer torque (STT) on the top reference layer, and generates indirect spin-transfer torque on the bottom reference layer. Such spin-transfer torques have a tendency of flipping the magnetization direction of the top reference layer, thereby rendering the conventional dual reference layer magnetoresistive memory cell inoperable.

The top reference layer encounters challenges achieving sufficient antiferromagnetic coupling and perpendicular magnetic anisotropy (PMA) for maintaining the downward magnetization direction. In other words, the magnetization direction of the top reference layer in the conventional memory cell is unstable. The spin-transfer torque that the free layer applies to the top magnetization layer is applied in a manner that helps flipping of the magnetization direction of the top reference layer upward, and is aided by stray magnetic fields emanating from the top hard magnetization layer, the free layer, and the bottom reference layer. Thus, maintaining the magnetization direction of the top reference layer in the downward direction is a challenge for the conventional dual MTJ STT-MRAM memory cells.

Mathematically, the effective field applied to the top reference layer having a downward magnetization from other layers of the layer stack in the conventional dual MTJ STT-MRAM memory cell while the free layer has an upward magnetization direction is given by: $h_{eff}(RL)=-h_{m,THL}-h_{m,FL}-h_{STT,FL}-h_{m,BRL}+h_{m,BHL}$, in which $h_{m,THL}$ represents the effective field due to the magnetization of the top hard magnetization layer, $h_{m,FL}$ represents the effective field due to the magnetization of the free layer, $h_{STT,FL}$ represents the effective field due to the spin-torque transfer effect from the free layer, $h_{m,BRL}$ represents the effective field due to the magnetization of the bottom reference layer, and $h_{m,BHL}$ represents the effective field due to the magnetization of the bottom hard magnetization layer. The negative signs correspond to a direction that promotes flipping of the downward magnetization of the top reference layer upward, and the positive sign corresponds a direction that suppresses flipping of the downward magnetization of the top reference layer. Likewise, the effective field applied to the top reference layer having a downward magnetization from other layers of the layer stack in the conventional dual MTJ STT-MRAM memory cell while the free layer has a downward magnetization direction is given by: $h_{eff}(RL)=-h_{m,THL}+h_{m,FL}-h_{STT,FL}-h_{m,BRL}+h_{m,BHL}$. Thus, the effective field that induces back-hopping on the top reference layer is the greatest when the magnetization of the free layer is parallel to the magnetization of the bottom reference layer. The back-hopping of the top reference layer induced by the effective field from other layers in the layer stack can cause a high write error rate during operation of the conventional dual MTJ STT-MRAM memory cell.

Embodiments of the present disclosure provide a solution for reducing back-hopping by providing a dual MTJ STT-MRAM memory cell in which a top reference layer and a bottom reference layer that are located on opposite sides of a free layer have parallel magnetization direction during the writing of the memory cell. Various aspects of the present disclosure are now described with reference to accompanying figures.

In one embodiment, one of the two reference layers comprises a negative spin polarization material which provides a stable dual MTJ STT-MRAM memory cell operation in the configuration in which the top reference layer and the bottom reference layer have the same magnetization direction. In one embodiment, the other one of the two reference layers comprises a positive spin polarization material. The parallel alignment of magnetization directions of the two reference layers of the embodiments of the present disclosure mitigates the back-hopping problem in the dual MTJ STT-MRAM memory cell.

Referring to FIG. 1, a schematic diagram is shown for a magnetoresistive random access memory (MRAM) device 500 including memory cells 180 of any embodiment of the present disclosure in an array configuration. The MRAM device 500 includes an array of memory cells 180, which may be configured as a two-dimensional array or as a three-dimensional array. As used herein, a "random access memory" (RAM) refers to a memory device containing memory cells that allow random access, e.g., access to any selected memory cell upon a command for reading the contents of the selected memory cell. The MRAM device 500 of the embodiment of the present disclosure is a random access memory device including a magnetoresistive memory element within each memory cell.

The MRAM device 500 of an embodiment of the present disclosure includes a memory array region 550 containing an array of memory cells 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). Each of the memory cells 180 can be a two terminal memory cell including a respective first electrode and a respective second electrode. In one embodiment, the first electrodes can be connected to the first electrically conductive lines 30, and the second electrodes can be connected to the second electrically conductive lines 90. Alternatively, the first electrodes can be connected to the second electrically conductive lines 90, and the first electrodes can be connected to the first electrically conductive lines 30.

The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the memory cells 180 are provided in an array configuration that forms the MRAM device 500. It should be noted that the location and interconnection of elements are schematic and the elements may be arranged in a different configuration. Further, a memory cell 180 may be manufactured as a discrete device, i.e., a single isolated device.

Each memory cell 180 includes two magnetic tunnel junctions including a common free layer. The two magnetic tunnel junctions are provided between a first electrode and a second electrode within each memory cell 180. In one embodiment, each memory cell 180 can be a spin-transfer torque (STT) magnetoresistive memory cell in which the magnetization of the free layer can be programmed deterministically by bidirectional spin-polarized current that tunnels through two magnetic tunnel junctions. The details of the embodiment memory cell 180 are now described in detail.

Figure 2A:
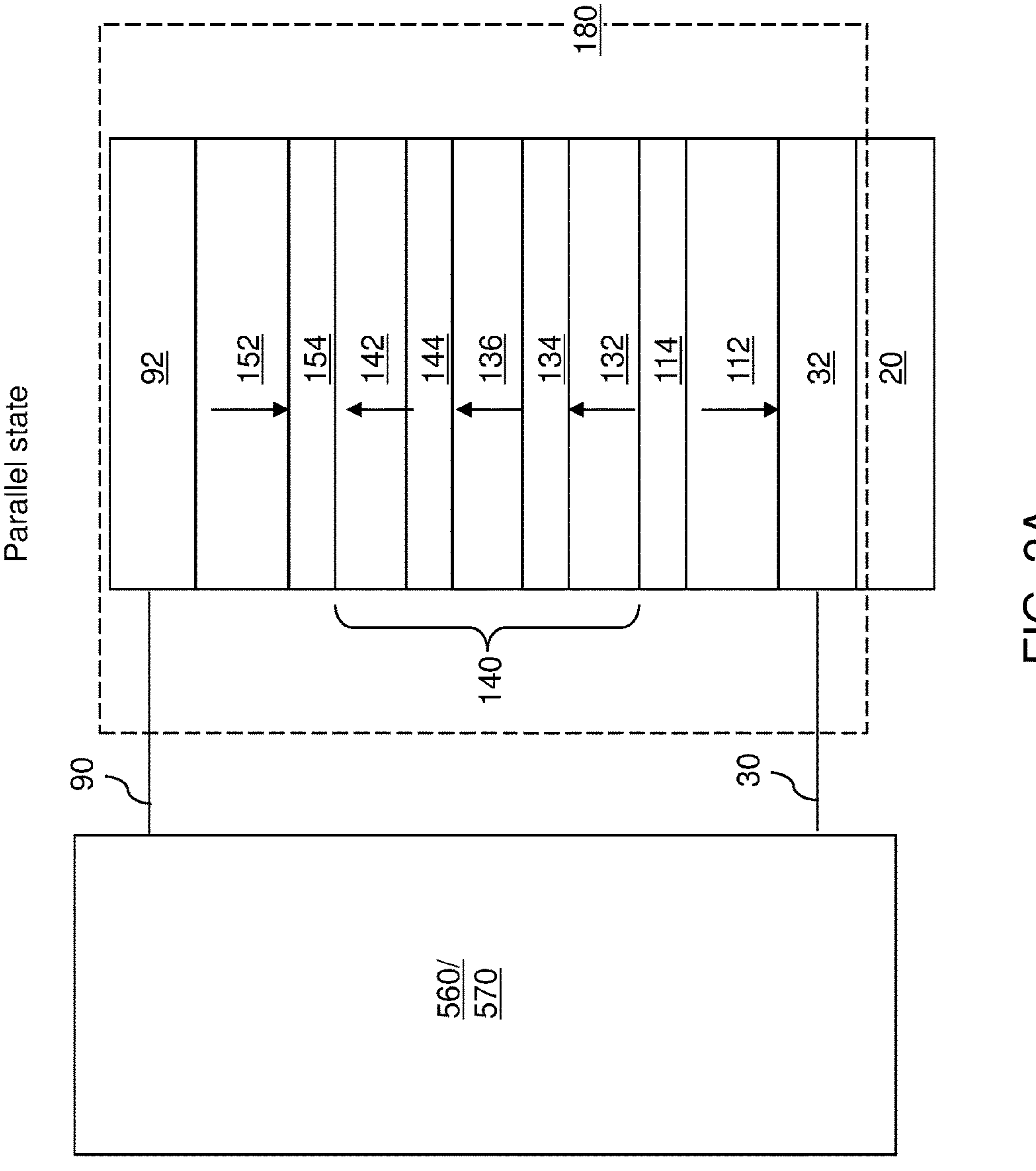
FIG. 2A illustrates a magnetoresistive memory cell in a parallel free layer state according to an embodiment of the present disclosure.
Figure 2B:
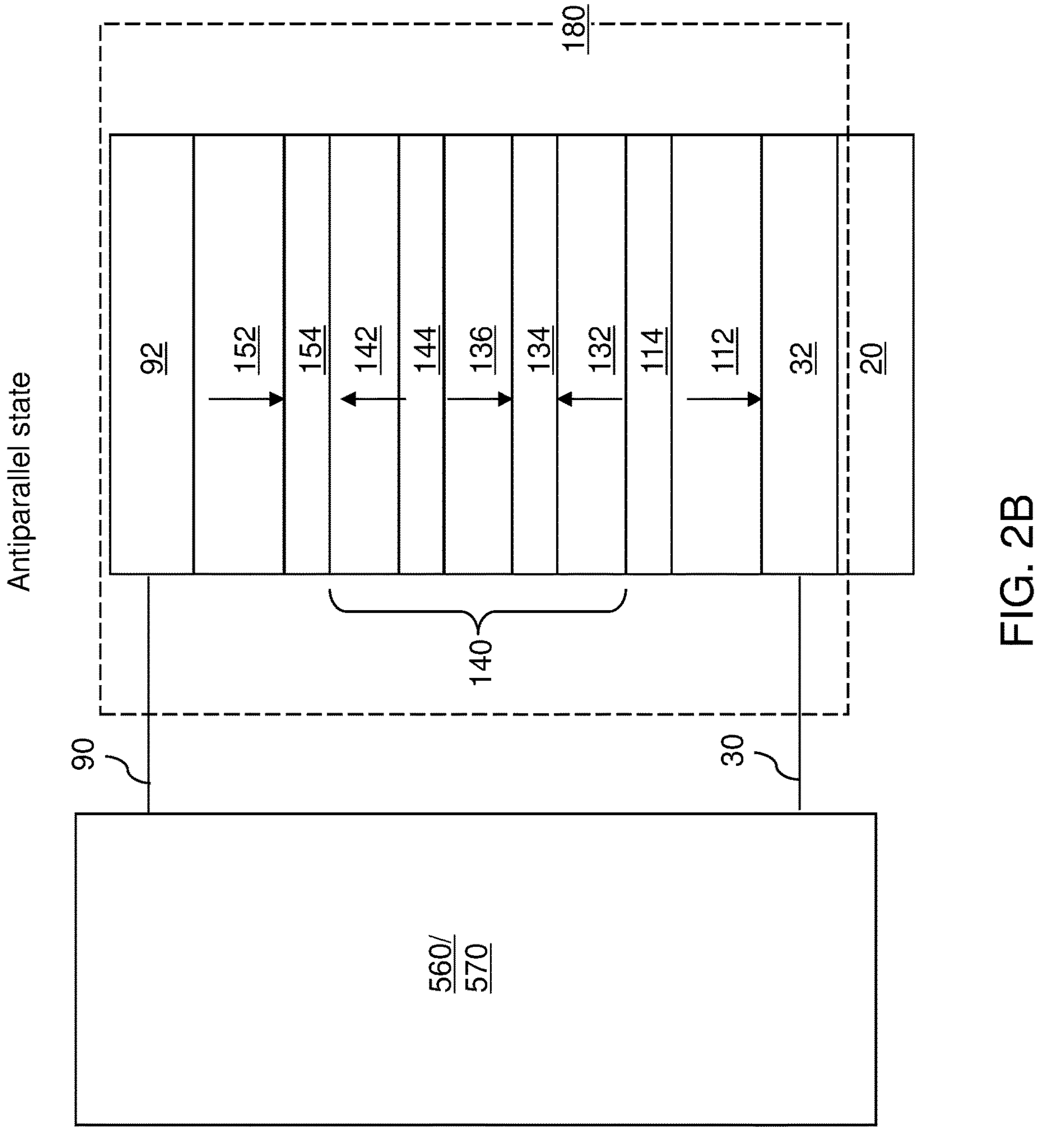
FIG. 2B illustrates the magnetoresistive memory cell in an antiparallel free layer state according to an embodiment of the present disclosure.

FIG. 2A illustrates a magnetoresistive memory cell 180 of a dual MTJ STT-MRAM device in a parallel free layer state according to a first embodiment of the present disclosure. FIG. 2B illustrates the magnetoresistive memory cell 180 in an antiparallel free layer state according to the first embodiment of the present disclosure. Thus, FIGS. 2A and 2B illustrate the same magnetoresistive memory cell 180 in two different programmed states, i.e., in a parallel free layer state in which the magnetization direction of the free layer is parallel to the magnetization direction of the reference layers, as shown in FIG. 2A, and in an antiparallel free layer state, in which the magnetization direction of the free layer is antiparallel to the magnetization direction of the reference layers, as shown in FIG. 2B.

The magnetoresistive memory cell 180 can be formed on any support or substrate, such as an insulating support 20 (which may include a silicon oxide layer), and can include a first electrode 32 that may be electrically connected to or comprises a portion of a first electrically conductive line 30 (such as a word line or a bit line) and a second electrode 92 that may be electrically connected to or comprises a portion of a second electrically conductive line 90 (such as a bit line or a word line). The magnetoresistive memory cell 180 further comprises a layer stack (112, 114, 132, 134, 136, 144, 142, 154, 152) located between the first electrode 32 and the second electrode 92. The layer stack (112, 114, 132, 134, 136, 144, 142, 154, 152) comprises a dual magnetic tunnel junction (MTJ) 140, which comprise, from one end to another, a first reference layer 132, a first tunnel barrier layer 134, a free layer 136, a second tunnel barrier layer 144, a second reference layer 142.

In one embodiment, a first one of the first reference layer 132 and the second reference layer 142 comprises a positive spin polarization material, and a second one of the first reference layer 132 and the second reference layer 142 comprises a negative spin polarization material. In one embodiment, the first reference layer 132 comprises a positive spin polarization material, and the second reference layer 142 comprises a negative spin polarization material. Alternatively, the second reference layer 142 comprises a positive spin polarization material, and the first reference layer 132 comprises a negative spin polarization material.

Positive spin polarization refers to a phenomenon in which the spin direction of electrons passing through a magnetic material aligns with the direction of magnetization of the magnetic material. In other words, the magnetization direction is parallel to the direction of the spin polarized current. A magnetic material that provides positive spin polarization is herein referred to as a positive spin polarization material. Positive spin polarization occurs in most ferromagnetic materials. In contrast, negative spin polarization refers to a phenomenon in which the spin direction of electrons passing through a magnetic material aligns along the opposite direction of the direction of magnetization of the magnetic material. In other words, the magnetization direction is antiparallel (i.e., opposite) to the direction of the spin polarized current. A magnetic material that provides negative spin polarization is herein referred to as a negative spin polarization material. Examples of positive spin polarization materials include iron, cobalt, nickel, and their alloys (e.g., CoFe, CoFeB, NiFe, etc). Examples of negative spin polarization materials include disordered body centered cubic FeCr alloys (e.g., $Fe_{1-x}Cr_x$ with the x value of below 0.7), $Mn_2VGa$ Heusler alloys, $Fe_4N$ and $SrRuO_3$.

Figures 3A, 3B:
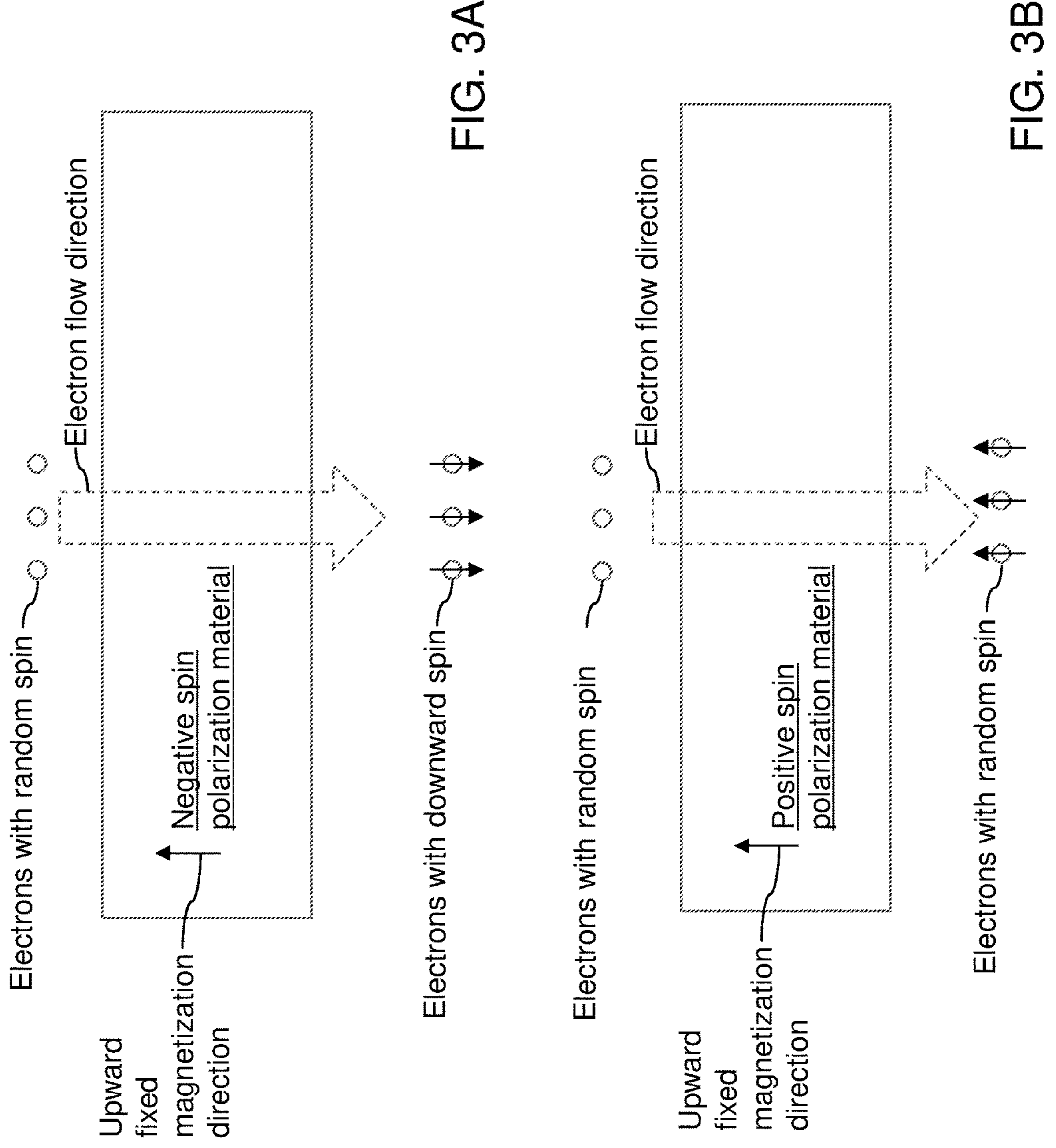
FIG. 3A-3D are schematic illustrations of spin polarization changes for electrons passing through a spin polarization material in case the first reference layer and the second reference layer have upward magnetization directions.
Figures 3C, 3D:
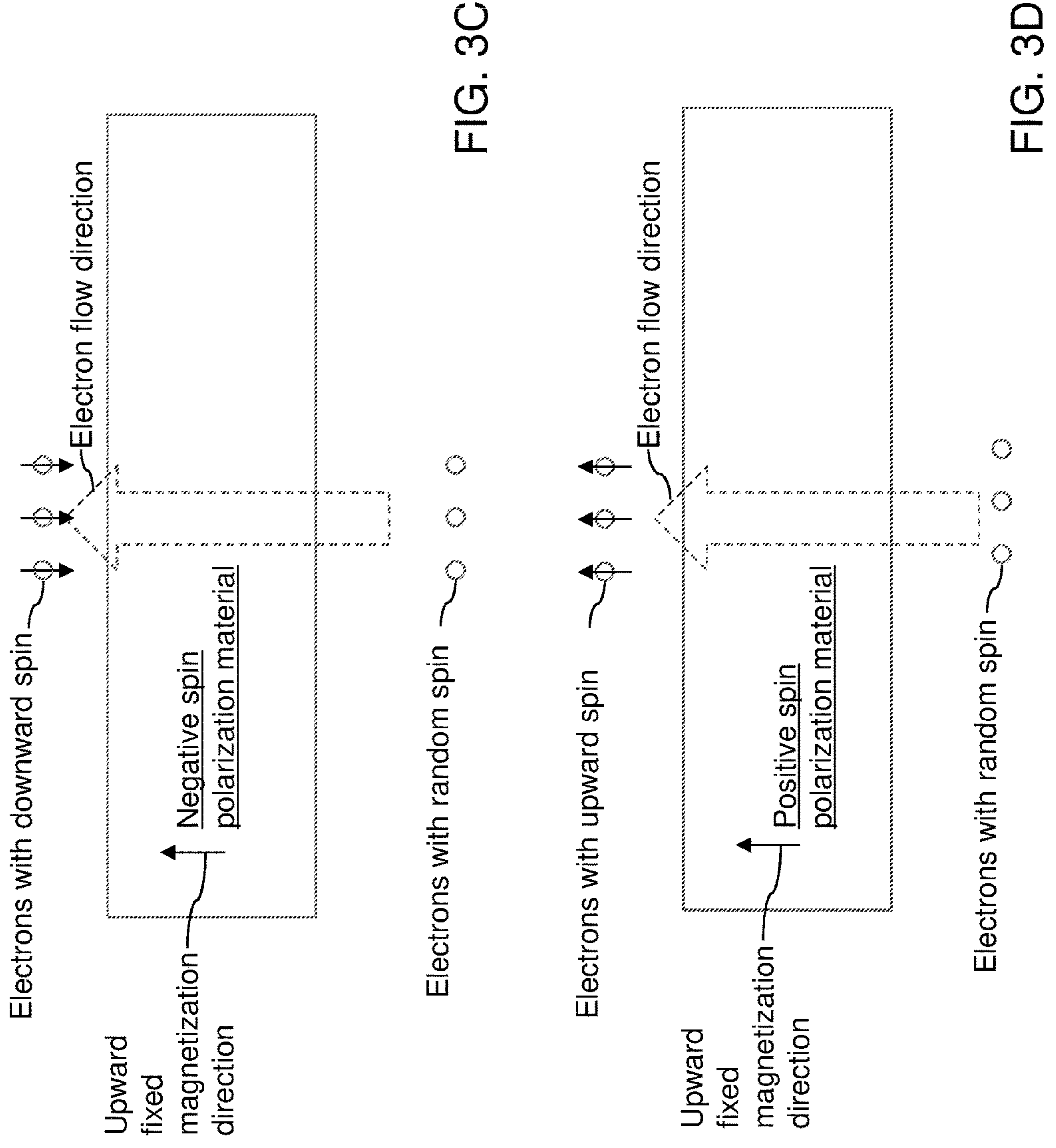

FIGS. 3A-3D illustrate effects of spin polarization materials on the spin distribution of electrons that pass through a respective spin polarization material. FIG. 3A illustrates the effect of a negative spin polarization material on electrons with random spin that flow downward while the magnetization direction of the negative spin polarization material points upward. FIG. 3B illustrates the effect of a positive spin polarization material on electrons with random spin that flow downward while the magnetization direction of the positive spin polarization material points upward. FIG. 3C illustrates the effect of a negative spin polarization material on electrons with random spin that flow upward while the magnetization direction of the negative spin polarization material points upward. FIG. 3D illustrates the effect of a positive spin polarization material on electrons with random spin that flow upward while the magnetization direction of the positive spin polarization material points upward.

Thus, a series connection of a negative spin polarization material and a positive spin polarization material with a free layer therebetween provides spin-polarized electrons in the free layer in either spin direction (i.e., an upward direction or a downward direction) by selecting the direction current flow (i.e., the direction of flow of the electrons), and therefore STT from the two reference layers on the free layer are additive, and the switching current to flip the magnetization of the free layer is reduced. Thus, the use of a negative spin polarization material for one of the first reference layer 132 and the second reference layer 142 in conjunction with use of a positive spin polarization material for the other of the first reference layer 132 and the second reference layer 142 selects the direction of the spin of the electrons (i.e., the direction of the spin polarized current) that passes the free layer 136 between the upward direction and the downward direction in the magnetoresistive memory cell 180 illustrated in FIGS. 2A and 2B.

Referring back to FIGS. 2A and 2B, the magnetization direction of the second reference layer 142 is parallel to the magnetization direction of the first reference layer 132. In the magnetoresistive memory cell 180 illustrated in FIGS. 2A and 2B, the magnetization directions of the first reference layer 132 and the second reference layer 142 are downward.

In one embodiment, the magnetoresistive memory cell 180 comprises a first magnetic polarizer layer 112 located between the first electrode 32 and the first reference layer 132 and configured to stabilize the magnetization direction of the first reference layer 132. The first magnetic polarizer layer 112 can be any material layer or a material layer stack that can function as a first hard magnetization layer, i.e., a magnetic material layer having a stable magnetization direction. In one embodiment, the first magnetic polarizer layer 112 has a magnetization direction that is antiparallel to the magnetization direction of the first reference layer 132, and a first antiferromagnetic coupling layer 114 is located between the first magnetic polarizer layer 112 and the first reference layer 132 and provides antiferromagnetic coupling therebetween. In one embodiment, the first magnetic polarizer layer 112 comprises a ferromagnetic multilayer structure including a superlattice, an exchange-bias-inducing antiferromagnetic layer, or a stack of at least one ferromagnetic material layer and at least one antiferromagnetic layer. Alternatively, the first magnetic polarizer layer 112 comprises a hard magnetization layer (i.e., a permanent magnet).

In a non-limiting illustrative example, the first magnetic polarizer layer 112 may comprise a superlattice of cobalt layers and platinum layers. The number repetitions of a combination of a cobalt layer and a platinum layer may be in a range from 2 to 10, such as from 3 to 6, although lesser and greater number of repetitions may also be employed. In an illustrative example, the cobalt layers may have a respective thickness of 0.2 nm to 0.5 nm, and the platinum layers may have a respective thickness of about 0.1 nm to 0.3 nm. It is understood that a material layer having a thickness that is less than the thickness of a monolayer refers to a discontinuous layer having a fractional coverage that is equal to the ratio of the thickness of the material layer to the thickness of the monolayer.

The first antiferromagnetic coupling layer 114 has a material composition and a thickness that provide antiferromagnetic coupling between the first magnetic polarizer layer 112 and the first reference layer 132. In one embodiment, the first antiferromagnetic coupling layer 114 can include ruthenium or iridium, and can have a thickness in a range from 0.3 nm to 0.8 nm. The combination of the first magnetic polarizer layer 112, the first antiferromagnetic coupling layer 114 and the first reference layer 132 may comprise a first synthetic antiferromagnetic structure ("SAF").

The magnetoresistive memory cell 180 comprises a second magnetic polarizer layer 152 located between the second electrode 92 and the second reference layer 142 and configured to stabilize the magnetization direction of the second reference layer 142. The second magnetic polarizer layer 152 can be any material layer or a material layer stack that can function as a second hard magnetization layer, i.e., a magnetic material layer having a stable magnetization direction. The second magnetic polarizer layer 152 has a magnetization direction that is antiparallel to the magnetization direction of the second reference layer 142, and a second antiferromagnetic coupling layer 154 is located between and contacts each of the second magnetic polarizer layer 152 and the second reference layer 142 and provides antiferromagnetic coupling therebetween. Thus, the magnetization direction of the second magnetic polarizer layer 152 is parallel to the magnetization direction of the first magnetic polarizer layer 112. The second magnetic polarizer layer 152 may comprise a layer or layer stack having the same composition as the first magnetic polarizer layer 112. In the magnetoresistive memory cell 180, the magnetization directions of the first magnetic polarizer layer 112 and the second magnetic polarizer layer 152 are downward.

In one embodiment, the first tunnel barrier layer 134 is located between (and optionally in contact with) a first surface of the free layer 136 and with a surface of the first reference layer 132, and the second tunnel barrier layer 144 is located between (and optionally in contact with) a second surface of the free layer 136 and with a surface of the second reference layer 142. The first and second tunnel barrier layers (134, 144) may comprise MgO or another suitable electrically insulating material.

In one embodiment, the second reference layer 142 overlies the first reference layer 132; the first reference layer 132 comprises the positive spin polarization material; and the second reference layer 142 comprises the negative spin polarization material. Alternatively, the second reference layer 142 overlies the first reference layer 132; the first reference layer 132 comprises the negative spin polarization material; and the second reference layer 142 comprises the positive spin polarization material.

In one embodiment, the layer stack (112, 114, 132, 134, 136, 144, 142, 154, 152) can be formed by depositing a continuous layer stack and by patterning the continuous layer stack using an anisotropic etch process or an ion beam etching process. In this case, the layer stack (112, 114, 132, 134, 136, 144, 142, 154, 152) may be a vertical stack in which the first reference layer 132, the first tunnel barrier layer 134, the free layer 136, the second tunnel barrier layer 144, the second reference layer 142 are arranged along a vertical direction.

The magnetoresistive memory cell 180 may be provided in an MRAM array of the STT-MRAM device 500 described with reference to FIG. 1. In this case, the magnetoresistive memory cell 180 is a memory cell within a two-dimensional array of memory cells; the first electrode 32 contacts or is a portion of a word line (which may be a first electrically conductive line 30 or a second electrically conductive line 90) for the two-dimensional array of memory cells; and the second electrode 92 contacts or is a portion of a bit line (which may be a second electrically conductive line 90 or a first electrically conductive line 30) for the two-dimensional array of memory cells.

In the parallel state of FIG. 2A in which the magnetizations of the first reference layer 132 (i.e., the bottom reference layer) and the second reference layer 142 (i.e., the top reference layer) point upward and the magnetization of the free layer 136 points upward, the effective field applied to the second reference layer 142 from other layers of the layer stack in the magnetoresistive memory cell of the present disclosure is given by: $h_{eff}(RL)=-h_{m,THL}+h_{m,FL}+h_{STT,FL}+h_{m,BRL}-h_{m,BHL}$, in which $h_{m,THL}$ represents the effective field due to the magnetization of the top hard magnetization layer 152, $h_{m,FL}$ represents the effective field due to the magnetization of the free layer 136, $h_{STT,FL}$ represents the effective field due to the spin-torque transfer effect from the free layer 136, $h_{m,BRL}$ represents the effective field due to the magnetization of the bottom reference layer 132, and $h_{m,BHL}$ represents the effective field due to the magnetization of the bottom hard magnetization layer 112. The negative signs correspond to a direction that promotes flipping of the upward magnetization of the second reference layer 142 (i.e., the top reference layer) downward, and the positive sign corresponds a direction that suppresses flipping of the magnetization of the second reference layer 142.

Similarly, in the antiparallel state of FIG. 2B in which the magnetizations of the first reference layer 132 (i.e., the bottom reference layer) and the second reference layer 142 (i.e., the top reference layer) point upward and the magnetization of the free layer 136 points downward, the effective field applied to the second reference layer 142 from other layers of the layer stack in the magnetoresistive memory cell of the present disclosure is given by: $h_{eff}(RL)=-h_{m,THL}-h_{m,FL}+h_{STT,FL}+h_{m,BRL}-h_{m,BHL}$. Thus, for both directions of the magnetization of the free layer 136, the components of the effective field on the second reference layer 142 (i.e., the top reference layer) tend to cancel out among one another, and thus, back-hopping of the magnetization of the second reference layer 142 is reduced or eliminated in the embodiment magnetoresistive memory cell 180. Further, for both directions of the magnetization of the free layer 136, the components of the effective field on the first reference layer 132 (i.e., the bottom reference layer) also tend to cancel out among one another, and thus, back-hopping of the magnetization of the first reference layer 132 is also reduced or eliminated in the embodiment magnetoresistive memory cell 180. Thus, the frequency of a write error during operation of the embodiment magnetoresistive memory cell 180 can be significantly reduced.

Thus, in the parallel state of FIG. 2A, the spin transfer torque from the free layer 136 on the second reference layer 142 acts to stabilize the magnetization direction of the second reference layer 142, with the additional support from stray fields from both the free layer 136 and the first reference layer 132 for stabilizing the magnetization direction of the second reference layer 142. This reduced or eliminates the back-hopping problem for the top reference layer in the parallel state, and additionally reduces the probability of back-hopping in the antiparallel state. Therefore, use of a negative spin polarization material for one of the first reference layer 132 and the second reference layer 142 and use of a positive spin polarization material for another of the first reference layer 132 and the second reference layer 142 in conjunction with a parallel alignment of magnetization between the first reference layer 132 and the second reference layer 142 can reduce or eliminate back-hopping of the magnetization direction for the second reference layer 142 and also for the first reference layer 132.

Figure 4A:
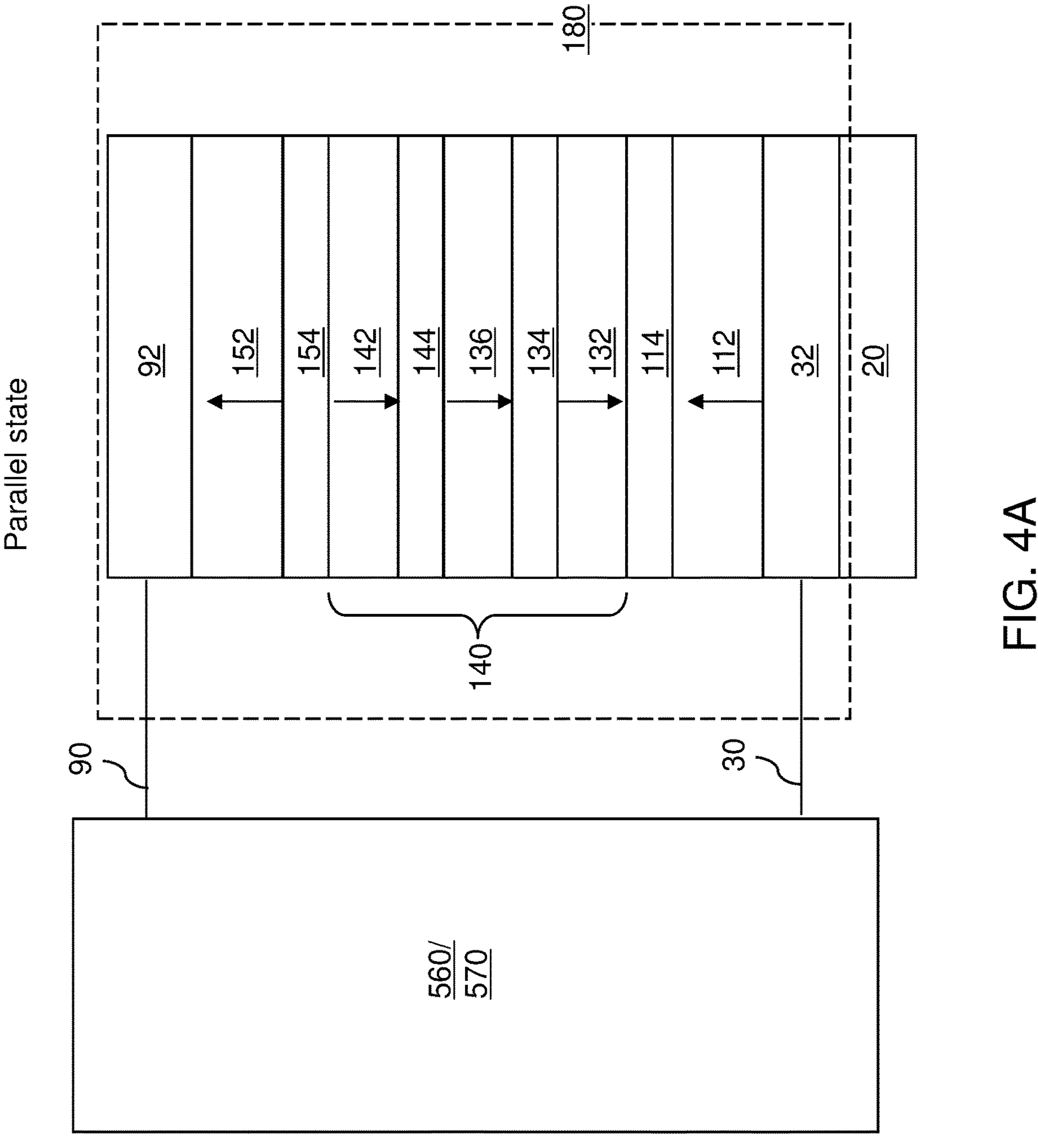
FIG. 4A illustrates an alternative configuration of a magnetoresistive memory cell in a parallel free layer state according to an embodiment of the present disclosure.
Figure 4B:
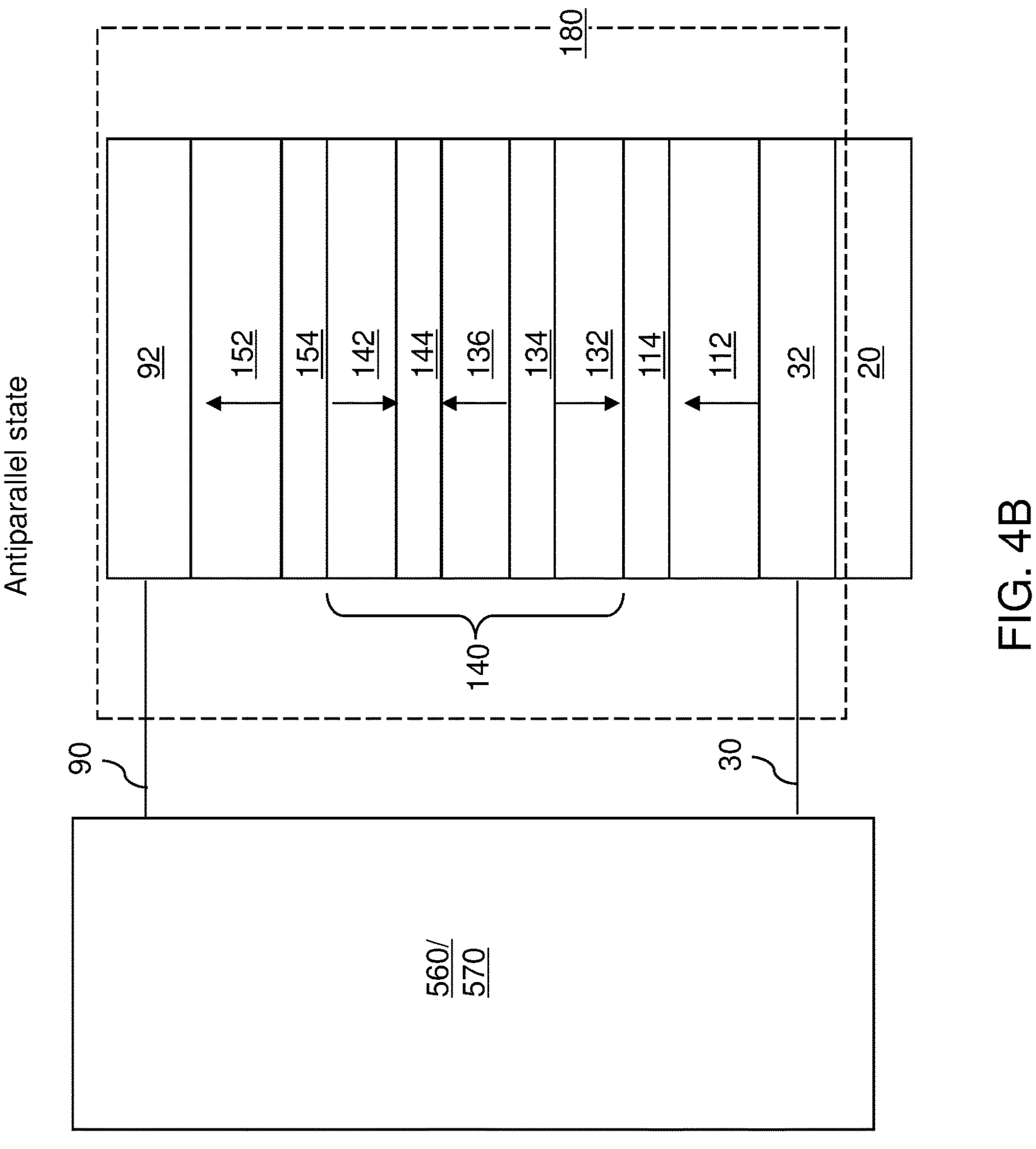
FIG. 4B illustrates the alternative configuration of the magnetoresistive memory cell in an antiparallel free layer state according to an embodiment of the present disclosure.

FIG. 4A illustrates an alternative configuration of a magnetoresistive memory cell 180 in a parallel state according to an embodiment of the present disclosure. FIG. 4B illustrates the alternative configuration of the magnetoresistive memory cell 180 in an antiparallel state according to an embodiment of the present disclosure.

Referring to FIGS. 4A and 4B, the alternative configuration of the magnetoresistive memory cell 180 can be derived from the magnetoresistive memory cell 180 illustrated in FIGS. 2A and 2B by reversing the magnetization directions of the first magnetic polarizer layer 112, the first reference layer 132, the second reference layer 142, and the second magnetic polarizer layer 152. Specifically, the magnetization directions of the first reference layer 132 and the second reference layer 142 are downward, and the magnetization direction of the first magnetic polarizer layer 112 and the second magnetic polarizer layer 152 are upward. The alternative configuration of the magnetoresistive memory cell 180 of FIGS. 4A and 4B operates in the same manner as the magnetoresistive memory cell 180 of FIGS. 2A and 2B except that the direction of the effective field on the free layer 136 is reversed in the alternative configuration of the magnetoresistive memory cell 180 of FIGS. 4A and 4B. The mechanism for enhancement of the stability of the magnetization direction of the second reference layer 142 and the magnetization direction of the first reference layer 132 is the same.

Figures 5A, 5B:
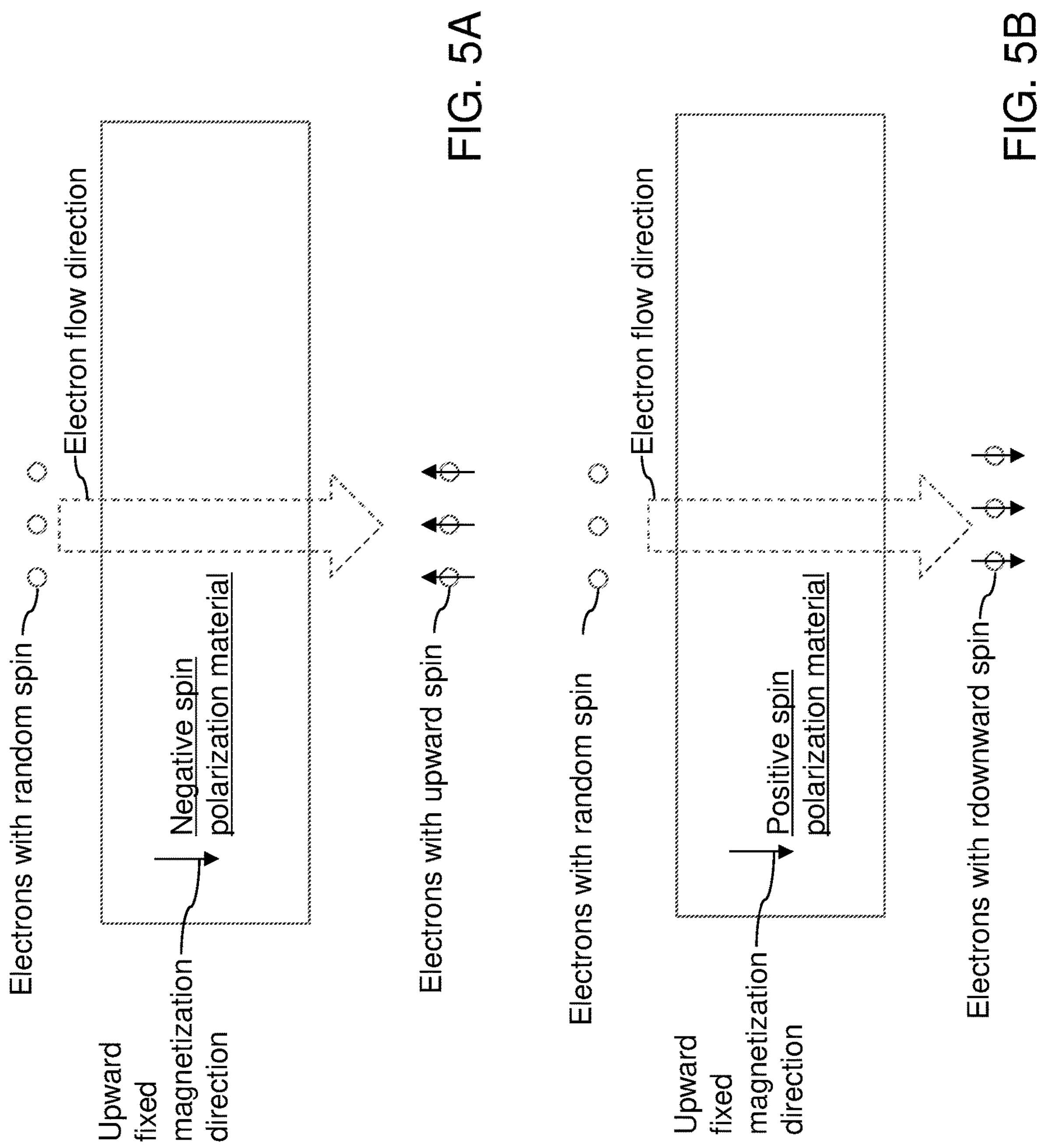
FIG. 5A-5D are schematic illustrations of spin polarization changes for electrons passing through a spin polarization material in case the first reference layer and the second reference layer have downward magnetization directions.
Figures 5C, 5D:
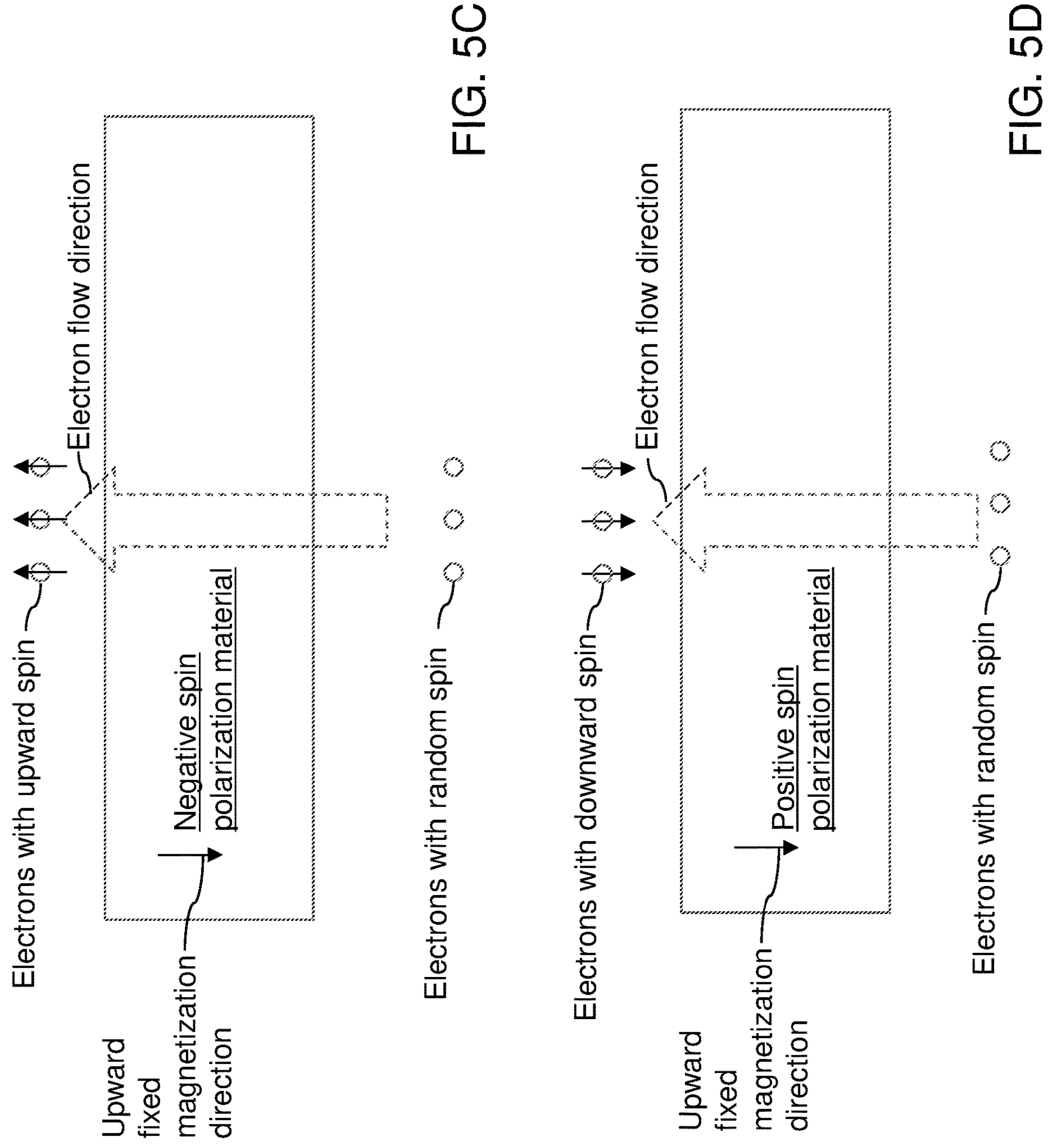

FIGS. 5A-5D illustrate effects of spin polarization materials on the spin distribution of electrons that pass through a respective spin polarization material. FIG. 5A illustrates the effect of a negative spin polarization material on electrons that flow downward while the magnetization direction of the negative spin polarization material points downward. FIG. 5B illustrates the effect of a positive spin polarization material on electrons that flow downward while the magnetization direction of the positive spin polarization material points downward. FIG. 5C illustrates the effect of a negative spin polarization material on electrons that flow upward while the magnetization direction of the negative spin polarization material points downward. FIG. 5D illustrates the effect of a positive spin polarization material on electrons that flow upward while the magnetization direction of the positive spin polarization material points downward.

Referring collectively to FIGS. 2A-5D and according to another aspect of the present disclosure, a method of operating a spin transfer torque (STT) magnetoresistive random memory (MRAM) device includes providing a magnetoresistive memory cell 180 which comprises a first electrode 32, a second electrode 92, and a layer stack (112, 114, 132, 134, 136, 144, 142, 154, 152) located between the first electrode 32 and the second electrode 92 comprises applying a read bias across the first electrode 32 and the second electrode 92 while the magnetization directions of the first reference layer 132 and the second reference layer 142 are parallel to each other; and determining a magnetization direction of the free layer 136 relative to the magnetization directions of the first reference layer 132 and the second reference layer 142 based on a magnitude of electrical current that flows through the layer stack (112, 114, 132, 134, 136, 144, 142, 154, 152) under the read bias voltage.

The magnetization directions of the first reference layer 132 and the second reference layer 142 are parallel to each other during a normal mode of operation for the magnetoresistive memory cell 180. In one embodiment, the magnetoresistive memory cell 180 may be programmed into a parallel state in which the magnetization direction of the free layer 136 is parallel to the magnetization directions of the first reference layer 132 and the second reference layer 142 by flowing a programming electrical current through the free layer 136 while the magnetization directions of the first reference layer 132 and the second reference layer 142 are parallel to each other. In one embodiment, the magnetoresistive memory cell 180 may be programmed into an antiparallel state in which the magnetization direction of the free layer 136 is antiparallel to the magnetization directions of the first reference layer 132 and the second reference layer 142 by flowing a programming electrical current through the free layer 136 while the magnetization directions of the first reference layer 132 and the second reference layer 142 are parallel to each other.

In one embodiment, a first one of the first reference layer 132 and the second reference layer 142 comprises a positive spin polarization material; and a second one of the first reference layer 132 and the second reference layer 142 comprises a negative spin polarization material.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A device comprising a magnetoresistive memory cell which comprises:
- a first electrode;
- a second electrode; and
- a layer stack located between the first electrode and the second electrode and comprising, from one end to another, a first reference layer, a first tunnel barrier layer, a free layer, a second tunnel barrier layer, and a second reference layer, wherein:
- a first one of the first reference layer and the second reference layer comprises a positive spin polarization material, wherein the positive spin polarization material causes a spin direction of electrons passing through the positive spin polarization material to align along a magnetization direction of the positive spin polarization material;
- a second one of the first reference layer and the second reference layer comprises a negative spin polarization material, wherein the negative spin polarization material causes a spin direction of electrons passing through the negative spin polarization material to align along an opposite direction of a magnetization direction of the negative spin polarization material; and
- a magnetization direction of the second reference layer is parallel to a magnetization direction of the first reference layer.

2. The device of claim 1, wherein the device comprises a spin transfer torque (STT) magnetoresistive random memory (MRAM) array comprising a plurality of dual magnetic tunnel junction STT-MRAM memory cells.

3. The device of claim 1, wherein the magnetoresistive memory cell further comprises a first magnetic polarizer layer located between the first electrode and the first reference layer.

4. The device of claim 3, further comprising a first antiferromagnetic coupling layer is located between the first magnetic polarizer layer and the first reference layer.

5. The device of claim 4, wherein the first magnetic polarizer layer has a magnetization direction that is antiparallel to the magnetization direction of the first reference layer.

6. The device of claim 4, wherein the first magnetic polarizer layer comprises a hard magnetization layer or a ferromagnetic multilayer structure including a superlattice, an exchange-bias-inducing antiferromagnetic layer, or a stack of at least one ferromagnetic material layer and at least one antiferromagnetic layer.

7. The device of claim 4, wherein the magnetoresistive memory cell further comprises a second magnetic polarizer layer located between the second electrode and the second reference layer.

8. The device of claim 7, further comprising a second antiferromagnetic coupling layer is located between the second magnetic polarizer layer and the second reference layer.

9. The device of claim 7, wherein:
- the second magnetic polarizer layer has a magnetization direction that is antiparallel to the magnetization direction of the second reference layer; and
- the magnetization direction of the first magnetic polarizer layer is parallel to the magnetization direction of the second magnetic polarizer layer.

10. The device of claim 1, wherein:
- the first tunnel barrier layer is in contact with a first surface of the free layer and with a surface of the first reference layer; and
- the second tunnel barrier layer is in contact with a second surface of the free layer and with a surface of the second reference layer.

11. The device of claim 1, wherein:
- the second reference layer overlies the first reference layer;
- the first reference layer comprises the positive spin polarization material; and
- the second reference layer comprises the negative spin polarization material.

12. The device of claim 1, wherein:
- the second reference layer overlies the first reference layer;
- the first reference layer comprises the negative spin polarization material; and
- the second reference layer comprises the positive spin polarization material.

13. The device of claim 1, wherein:
- the positive spin polarization material comprises Fe, Co, Ni or an alloy thereof; and the negative spin polarization material comprises $Fe_{1-x}Cr_x$ where x<0.7, a $Mn_2VGa$ Heusler alloy, $Fe_4N$ or $SrRuO_3$.

14. The device of claim 1, wherein:

the layer stack is a vertical stack in which the first reference layer, the first tunnel barrier layer, the free layer, the second tunnel barrier layer, the second reference layer are arranged along a vertical direction; and the layer stack is located over a support.

15. A method of operating a spin transfer torque (STT) magnetoresistive random memory (MRAM) device, comprising:

providing a magnetoresistive memory cell which comprises a first electrode, a second electrode, and a layer stack located between the first electrode and the second electrode and comprising, from one end to another, a first reference layer, a first tunnel barrier layer, a free layer, a second tunnel barrier layer, a second reference layer, wherein the first reference layer and the second reference layer have magnetization directions that are parallel to each other, and wherein a first one of the first reference layer and the second reference layer comprises a positive spin polarization material, wherein the positive spin polarization material causes a spin direction of electrons passing through the positive spin polarization material to align along a magnetization direction of the positive spin polarization material, and a second one of the first reference layer and the second reference layer comprises a negative spin polarization material, wherein the negative spin polarization material causes a spin direction of electrons passing through the negative spin polarization material to align along an opposite direction of a magnetization direction of the negative spin polarization material;

applying a read bias across the first electrode and the second electrode while the magnetization directions of the first reference layer and the second reference layer are parallel to each other; and determining a magnetization direction of the free layer relative to the magnetization directions of the first reference layer and the second reference layer based on a magnitude of electrical current that flows through the layer stack under the read bias.

16. The method of claim 15, further comprising programming the magnetoresistive memory cell into a parallel state in which the magnetization direction of the free layer is parallel to the magnetization directions of the first reference layer and the second reference layer by flowing a programming electrical current through the free layer while the magnetization directions of the first reference layer and the second reference layer are parallel to each other.

17. The method of claim 15, further comprising programming the magnetoresistive memory cell into an antiparallel state in which the magnetization direction of the free layer is antiparallel to the magnetization directions of the first reference layer and the second reference layer by flowing a programming electrical current through the free layer while the magnetization directions of the first reference layer and the second reference layer are parallel to each other, wherein the magnetoresistive memory cell stores binary data only in the parallel state and the antiparallel state.

18. The method of claim 15, wherein:

the positive spin polarization material comprises Fe, Co, Ni or an alloy thereof; and the negative spin polarization material comprises $Fe_{1-x}Cr_x$ where x<0.7, a $Mn_2VGa$ Heusler alloy, $Fe_4N$ or $SrRuO_3$.

19. The method of claim 15, wherein the magnetoresistive memory cell further comprises:

a first magnetic polarizer layer located between the first electrode and the first reference layer;

a first antiferromagnetic coupling layer is located between the first magnetic polarizer layer and the first reference layer;

a second magnetic polarizer layer located between the second electrode and the second reference layer; and a second antiferromagnetic coupling layer is located between the second magnetic polarizer layer and the second reference layer.

20. The device of claim 1, wherein the magnetoresistive memory cell is configured to store binary data by being in one of only two stable data states consisting of:

a parallel state in which the magnetization direction of the free layer is parallel to the magnetization directions of the first and second reference layers; and an antiparallel state in which the magnetization direction of the free layer is antiparallel to the magnetization directions of the first and second reference layers.

* * * * *